United States Patent
Chang et al.

(10) Patent No.: US 8,779,826 B1
(45) Date of Patent: Jul. 15, 2014

(54) POWER SPLITTER AND COMBINER

(71) Applicant: Cambridge Silicon Radio Limited, Cambridge (GB)

(72) Inventors: Simon Chang, Cambridge (GB); Philip Macphail, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 30 days.

(21) Appl. No.: 13/750,292

(22) Filed: Jan. 25, 2013

(51) Int. Cl.
*H03L 5/00* (2006.01)

(52) U.S. Cl.
USPC ........................................ 327/306; 333/81 R (58) Field of Classification Search
USPC .......... 327/306, 333; 333/124, 100, 129, 131, 333/132; 326/61, 80
See application file for complete search history.

(56) References Cited

U.S. PATENT DOCUMENTS 5,430,418 A * 7/1995 Blodgett ....................... 333/100
5,469,129 A * 11/1995 Dydyk ........................... 333/124

OTHER PUBLICATIONS

An et al., "Power-Combining Transformer Techniques for Fully-Integrated CMOS Power Amplifiers", IEEE Journal of Solid-State Circuits, vol. 43, No. 5, May 2008, pp. 1064-1075.
Kim et al., "A Fully-Integrated High-Power Linear CMOS Power Amplifier With a Parallel-Series Combining Transformer", IEEE Journal of Solid-State Circuits, vol. 47, No. 3, Mar. 2012, pp. 599-614.

* cited by examiner

*Primary Examiner* — Dinh T. Le
(74) *Attorney, Agent, or Firm* — RatnerPrestia (57) ABSTRACT

An electronic device is described, the device including a first circuit arranged to transfer a signal with a first predetermined phase shift, a second circuit, connected in series with the first circuit, arranged to transfer a signal with a second predetermined phase shift, and a resistance connected in parallel with the first and second circuits, wherein the first circuit includes a first capacitance connected between a first pair of nodes, a second capacitance connected between a second pair of nodes, and a first transformer having a first winding connected between the first pair of nodes and a second winding connected between the second pair of nodes.

29 Claims, 6 Drawing Sheets

POWER SPLITTER AND COMBINER

TECHNICAL FIELD

Embodiments of this invention relate to electronic circuits, for example those that can be used as a power splitter and/or power combiner.

BACKGROUND

A power combiner can be used to combine the power of two signals, i.e. to add the signals. A power splitter can be used to split the power into two signals, for example two substantially identical signals each comprising a substantially equal portion of the power of the input signal. Some power combiners can also be used as power splitters depending on how they are connected to input signals.

One example of a power splitter and combiner is a Wilkinson power combiner. One advantage of a Wilkinson power combiner is isolation of two input signals, so that one input signal does not appear at the other input terminal, which could cause distortion in a driving circuit.

Figure 1:
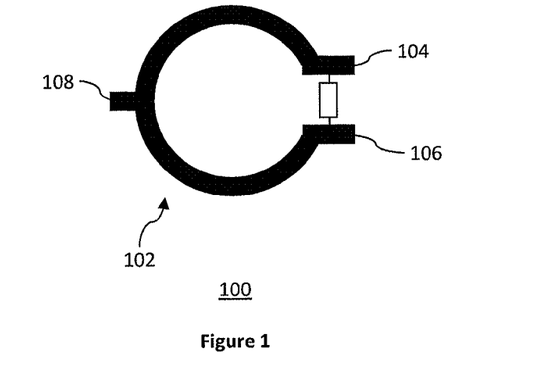
FIG. 1 shows an example of a known Wilkinson power combiner/splitter.

FIG. 1 shows an example of a Wilkinson power combiner 100, when used as a power combiner. The power combiner 100 includes a curved conductor or transmission line 102. A first input signal is provided to one end 104 of the transmission line 102, and a second input signal is provided to the other end 106. An output signal is taken from a mid point 108 of the transmission line 102. A resistor 110 is connected between the ends 104 and 106 of the transmission line 102.

The power combiner 100 is arranged such that a propagation delay or phase shift of an input signal between either end 104 and 106 and the mid point 108 is $\lambda/4$, where $\lambda$ is preferably substantially the wavelength of at least one of the input signals. Thus a path from input 104 to mid point 108 is a quarter-wave transmission line, as is a path from input 106 to mid point 108. A characteristic impedance between either end 104 and 106 and the mid point 108 is $\sqrt{2}Z_0$. The resistance of the resistor 110 is $2Z_0$.

In use, when input signals are applied to the ends 104 and 106, a mixed signal is obtained at mid point 108.

Kim et al. (2012), "A Fully-Integrated High-Power Linear CMOS Power Amplifier With a Parallel-Series Combining Transformer," IEEE Journal of Solid-State Circuits, Volume 47, Issue 3, March 2012, 599-614 describes a linear CMOS power amplifier for high data-rate mobile applications

SUMMARY OF EMBODIMENTS OF THE INVENTION

According to a first aspect of embodiments of the invention, there is provided an electronic device comprising first means arranged to transfer a signal with a first predetermined phase shift; second means, connected in series with the first means, arranged to transfer a signal with a second predetermined phase shift; a resistance connected in parallel with the first and second means; wherein the first means comprises a first capacitance connected between a first pair of nodes, a second capacitance connected between a second pair of nodes, and a first transformer having a first winding connected between the first pair of nodes and a second winding connected between the second pair of nodes.

Thus, one signal that is transferred (or propagates) from one point in the device to another point in the device is subject to a predetermined phase shift, such as for example $\lambda/4$ where $\lambda$ is a frequency of the signal. Therefore, a device is provided that may, in some embodiments, function in a manner similar or identical to a Wilkinson power combiner/splitter. For example, compared to a known Wilkinson power combiner/splitter that comprises a transmission line, the transmission line or at least a portion of the transmission line may be replaced by a combination of capacitances and transformer(s).

In some embodiments, the second means comprises a third capacitance connected between a third pair of nodes, a fourth capacitance connected between the second pair of nodes, and a second transformer having a first winding connected between the third pair of nodes and a second winding connected between the fourth pair of nodes. One of the third pair of nodes could be connected to ground, allowing a single-ended signal to be used. Another of the third pair of nodes may be arranged to receive a single-ended input signal or to provide an output signal. Alternatively, the third pair of nodes may be arranged to receive a differential input signal or to provide a differential output signal.

In some embodiments, the resistance comprises a first resistance connected between one of the first pair of nodes and one of the second pair of nodes, and a second resistance connected between another of the first pair of nodes and another of the second pair of nodes.

In some embodiments, the first winding of the second transformer has a centre tap arranged to be connected to a bias voltage. With this arrangement, for example, a connected amplifier may be biased with the bias voltage, thus avoiding the need to provide a bias voltage to the amplifier in other ways. Additionally or alternatively, the first winding of the first transformer has a centre tap arranged to be connected to a bias voltage or current source.

In some embodiments, one of the first pair of nodes may be connected to ground. Another of the first pair of nodes may be arranged to receive an input signal or to provide an output signal. Alternatively, the first pair of nodes may be arranged to receive a differential input signal or to provide a differential output signal.

Similarly, in some embodiments, one of the second pair of nodes may be connected to ground. Another of the second pair of nodes may be arranged to receive an input signal or to provide an output signal. Alternatively, the second pair of nodes may be arranged to receive a differential input signal or to provide a differential output signal.

In some embodiments, the first predetermined phase shift is substantially equal to the second predetermined phase shift.

The device may be operated as a power combiner or a power splitter.

The first winding and second winding of the first transformer may have an equal or different number of turns. Where the number of turns is equal, the impedance seen at both sides of the transformer (and thus seen by an input and output signal, for example) may be the same or substantially similar. Where the number of turns is different, however, the impedance seen at both sides may also be different, which could be advantageous depending on implementation of connected components such as an amplifier for example.

According to a second aspect of embodiments of the invention, there is provided an electronic device, comprising a first capacitance connected between a first pair of nodes, a second capacitance connected between a second pair of nodes, and a transformer having a first winding connected between the first pair of nodes and a second winding connected between the second pair of nodes; a third capacitance connected between a third pair of nodes, the transformer having a third winding connected between the third pair of nodes; a first resistance connected between one of the first pair of nodes and one of the third pair of nodes; and a second resistance connected between another of the first pair of nodes and another of the second pair of nodes.

The device may also comprise a fourth capacitance connected in parallel with the first resistance, and a fifth capacitance connected in parallel with the second resistance. Additionally or alternatively, a further capacitance may be connected between the second pair of nodes.

At least two of the first, second and third windings may have an equal or different number of turns.

Embodiments of the invention may also include a communications device including an electronic device according to the first or second aspect. The device may comprise, for example, any device capable of sending and/or receiving communications, such as a mobile phone, PDA, portable or non-portable computing device, base station, wireless access point and the like.

BRIEF DESCRIPTION OF THE DRAWINGS

Embodiments of the invention will now be described, by way of example only, with reference to the accompanying Figures, in which.

DETAILED DESCRIPTION OF EMBODIMENTS OF THE INVENTION

The Wilkinson power combiner 100 is unsuitable for use in CMOS radio frequency (RF) circuits due to the manufacturing processes involved. In addition, the power combiner 100 is a single-ended design and cannot be implemented for use with balanced signals. Balanced signals are advantageous in CMOS circuits due to the preference for a low voltage power supply.

Figure 2:
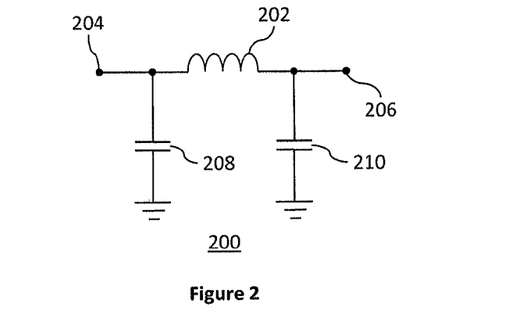
FIG. 2 shows an example of an electronic circuit.

The inventors have realised that at least a portion of the transmission line 102 of the Wilkinson power combiner 100 between either end 104 and 106 and the mid point 108 can be implemented using the circuit 200 shown in FIG. 2. The circuit 200 comprises an inductor 202 connected between two circuit nodes 204 and 206. A first capacitor 208 is connected between node 204 and ground, and a second capacitor 210 is connected between node 206 and ground. With selected values for the inductor 202 and capacitors 208 and 210, a signal applied to node 204 for example will appear at the node 206 with a phase shift of $\lambda/4$.

Figure 3:
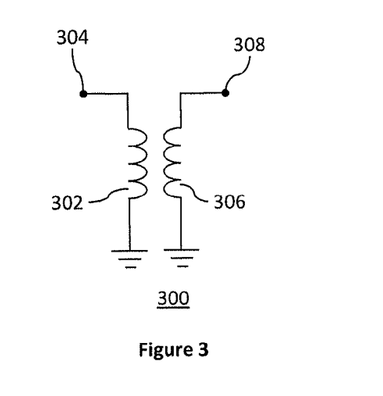
FIG. 3 shows an example of a transformer.

FIG. 3 shows a transformer 300. The transformer 300 includes a first winding 302 connected between a first node 304 and ground, and a second winding 306 connected between a second node 308 and ground. In a known manner, an input signal can be applied to one of the nodes 304 and 306, and an output signal can be taken from the other of the nodes 304 and 306.

Figure 4:
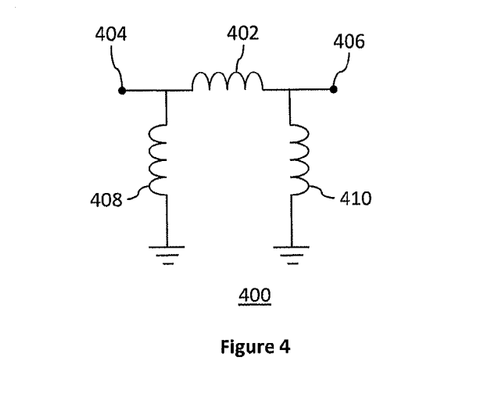
FIG. 4 shows an example of a transformer equivalent circuit including leakage inductance.

FIG. 4 shows circuit 400 that is equivalent to the transformer 300. The equivalent circuit 400 comprises a first inductor 402 connected between nodes 404 and 406. A second inductor 408 is connected between node 404 and ground, and a third inductor 410 is connected between node 406 and ground. The inductance values of the inductors 402, 408 and 410 are not necessarily equal to the inductance values of either of the transformer windings 302 and 306.

The inductance 402 between nodes 404 and 406 arises due to magnetic flux leakage in the transformer 300. As this reduces the efficiency of the transformer 300, transformer designers have attempted to minimise the magnetic flux leakage and hence the "leakage" inductance 402.

Figure 5:
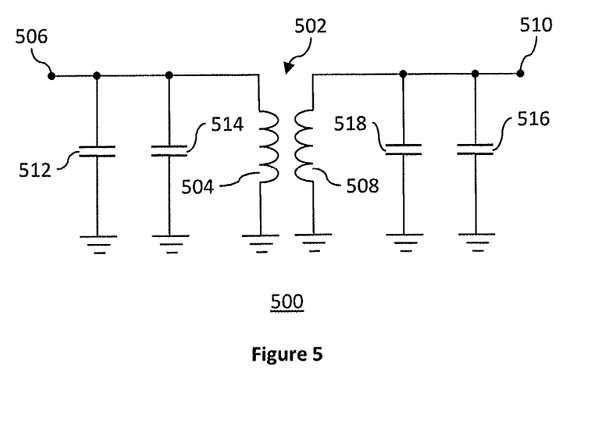
FIG. 5 shows a first circuit or device according to embodiments of the invention.

The inventors have realised that the leakage inductance of a transformer can be used to implement the inductance 202 of the circuit 200 of FIG. 2. Furthermore, capacitors can be used to cancel the inductances 408 and 410. An example of such a circuit 500 is shown in FIG. 5. The circuit 500 includes a transformer 502 having a first winding 504 connected between a node 506 and ground, and a second winding 508 connected between a node 510 and ground. A first capacitor 512 is connected between node 506 and ground. This capacitor can be regarded as being equivalent in purpose to capacitor 208 shown in FIG. 2. A second capacitor 514 is connected between node 506 and ground, and cancels at least some of the inductance of the transformer equivalent inductance 408 shown in FIG. 4.

Similarly, a third capacitor 516 is connected between node 510 and ground. This capacitor can be regarded as being equivalent in purpose to capacitor 210 shown in FIG. 2. A fourth capacitor 518 is connected between node 510 and ground, and cancels at least some of the inductance of the transformer equivalent inductance 410 shown in FIG. 4.

It is noted that although the capacitors 512, 514, 516 and 518 are shown as separate capacitors, this is for illustration purposes only. The capacitors 512 and 514 may, in some embodiments for example, be implemented as a single capacitor or more than two capacitors, and/or the capacitors 516 and 518 may, in some embodiments for example, be implemented as a single capacitor or more than two capacitors. In some embodiments, the total capacitance of capacitors 512 and 514 is substantially equal to the total capacitance of capacitors 516 and 518.

With selected values for the components in the circuit 500, it is possible to provide an input signal to node 506 for example, and extract an output signal at node 510 which has been phase shifted by $\lambda/4$, where $\lambda$ is a frequency of interest, such as substantially the frequency of the input signal for example.

Figure 6:
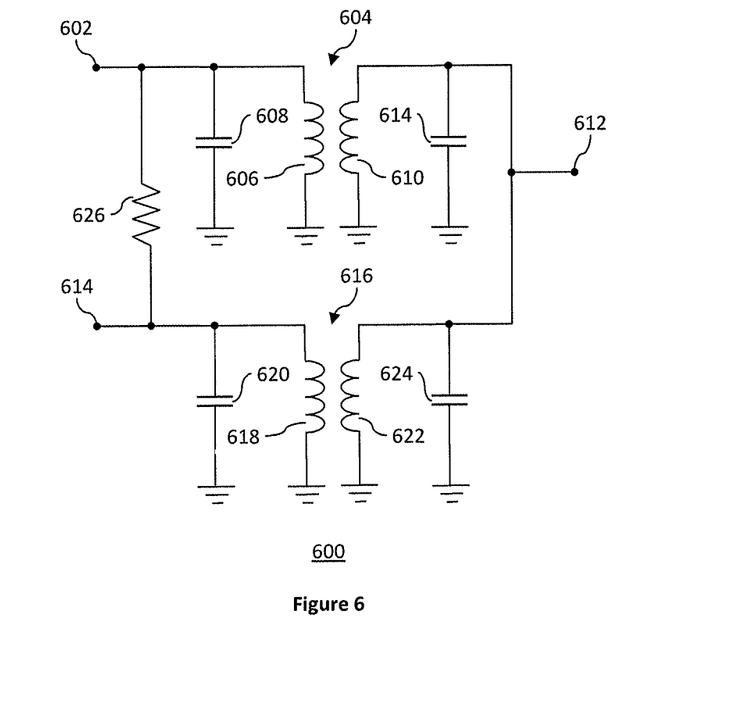
FIG. 6 shows a second circuit or device according to embodiments of the invention.

As a result, it is possible to replace at least a portion of the transmission line 102 of the Wilkinson power combiner 100 shown in FIG. 1 with at least one circuit 500. It is also possible to replace the transmission line 102 entirely with a pair of circuits 500. The resulting circuit 600 is shown in FIG. 6. When used as a power combiner, a first input signal may be provided to a node 602. A first transformer 604 includes a first winding 606 connected between node 602 and ground. A first capacitor 608 is connected between node 602 and ground.

The first transformer 604 includes a second winding 610 connected between a second node 612 and ground. A second capacitor 614 is connected between node 612 and ground. The node 612 provides an output signal from the circuit 600.

A second input signal may be provided to a node 614. A second transformer 616 includes a first winding 618 connected between node 614 and ground. A third capacitor 620 is connected between node 614 and ground. The second transformer 618 includes a second winding 622 connected between node 612 and ground. A fourth capacitor is connected between node 612 and ground. A resistor 626 is connected between nodes 602 and 614.

With selected values of the components of the circuit 600, the power from the first and second input signals provided to nodes 602 and 614 respectively is combined and provided at node 612. Therefore, in some embodiments, circuit 600 acts as a power combiner or mixer.

It is noted that although capacitors 614 and 624 are shown as separate capacitors, they may be implemented as a single capacitor or two or more capacitors. Similarly, other components may be implemented as multiple or equivalent components in some embodiments.

The circuit 600, although described as a power combiner, may also be used as a power splitter. The power of input signal provided to node 612 is divided between a first output signal at node 602 and a second output signal at node 614. With selected values of the components of the circuit 600, the power is divided equally between the two output signals. That is, the power of the first output signal is substantially equal to the power of the second output signal. In a practical implementation, circuit losses may mean that the total power of the two output signals is less than the power of the input signal.

In other embodiments, the circuit 600 may include one or more additional circuits 500 for one or more additional inputs (when used as a power combiner) or outputs (when used as a power splitter). For example, one further circuit 500 could be connected between a node for accepting a third input signal and the output node 612. Additional resistors may also be included, for example between the third input signal node and node 602, and/or the third input signal node and node 614.

Figure 7:
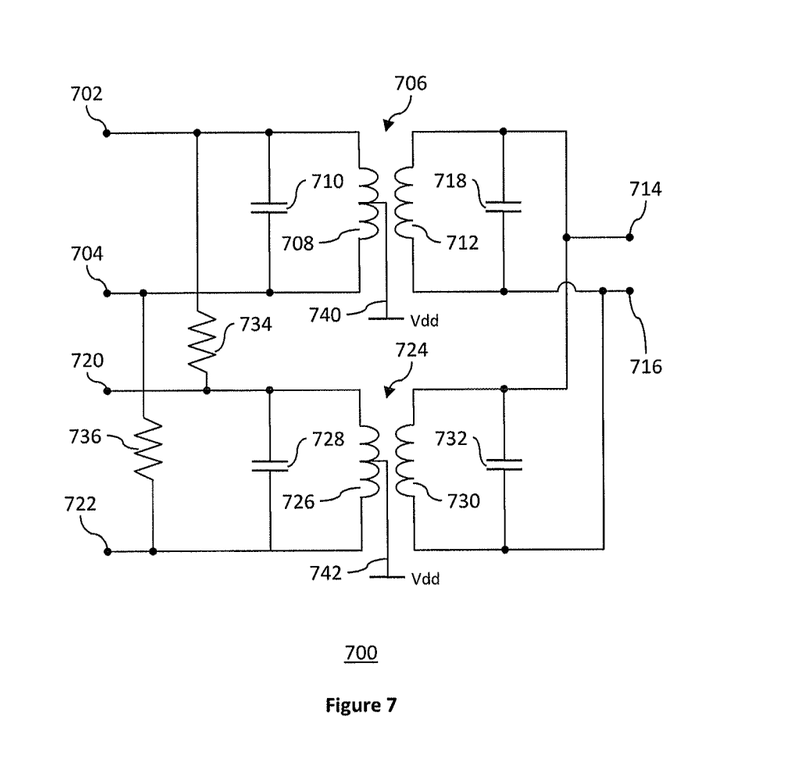
FIG. 7 shows a third circuit or device according to embodiments of the invention.

The circuit 600 may be more suitable for certain manufacturing process than, for example, the power combiner/splitter shown in FIG. 1. In addition, a differential version of the circuit 600 is envisaged. Such a circuit 700 is shown in FIG. 7. The circuit 700 includes a first pair of nodes 702 and 704. A first transformer 706 includes a first winding 708 connected between the first pair of nodes 702 and 704, and a first capacitor 710 connected between the nodes 702 and 704. The transformer 706 has a second winding 712 connected between a second pair of nodes 714 and 716, and a second capacitor 718 connected between nodes 714 and 716.

The circuit 700 also includes a third pair of nodes 720 and 722. A second transformer 724 has a first winding 726 connected between nodes 720 and 722, and a third capacitor 728 connected between nodes 720 and 722. The transformer 724 includes a second winding 730 connected between the second pair of nodes 714 and 716, and a fourth capacitance 732 connected between nodes 714 and 716. It is noted that although capacitors 718 and 732 are shown as separate capacitors, in other embodiments the capacitors 718 and 732 may be implemented as a single capacitor or two or more capacitors.

A first resistor 734 is connected between nodes 702 and 720, and a second resistor 736 is connected between nodes 704 and 722.

When the circuit 700 is used as a differential power combiner, a first differential input signal is provided to the nodes 702 and 704, and a second differential input signal is provided to the nodes 720 and 722. A differential output signal appears at nodes 714 and 716.

It is noted that connection of certain ones of each pair of nodes—for example nodes 704, 716 and 722—to ground would result in the circuit 600 of FIG. 6. (In this case, the resistor 736 would have no effect and can be regarded as being absent.) Therefore, connection of any one or more of nodes 704, 716 and 722 would result in a single-ended signal being required or produced. For example, connection of nodes 704 and 722 to ground would allow single-ended input signals to be provided to nodes 702 and 720, and the power combiner would output a balanced signal at nodes 714 and 716. As a result, when the circuit 700 is used as a power combiner, the circuit 700 may be fully differential as described above, or any one or more of the first and second input signals and the output signal may be a single-ended signal. Similarly, when the circuit 700 is used as a power splitter, the circuit 700 may be fully differential, or any one or more of the input signal and first and second output signals may be single-ended.

It is noted that though connections to ground in the circuits 600 and 700 are referred to, this is merely exemplary and any reference voltage may be used instead.

In a further development of the circuit 700, the first transformer 706 includes an optional centre tap 740 on its first winding 708. Additionally or alternatively, the second transformer 724 includes an optional centre tap 742 on its first winding 726. The centre tap may be used to provide a bias voltage. For example, a bias voltage or current may be provided to a power amplifier connected to the pair of nodes 7002 and 704 and/or the pair of nodes 720 and 722.

The circuit shown in FIG. 7 includes the benefits of the circuit of FIG. 6, and may also be particularly suited to CMOS circuits, for example those implementing RF communications devices, due to its differential nature. Therefore, it is suitable for use in circuits having low power supply voltages or arbitrary ground voltages.

Figure 8:
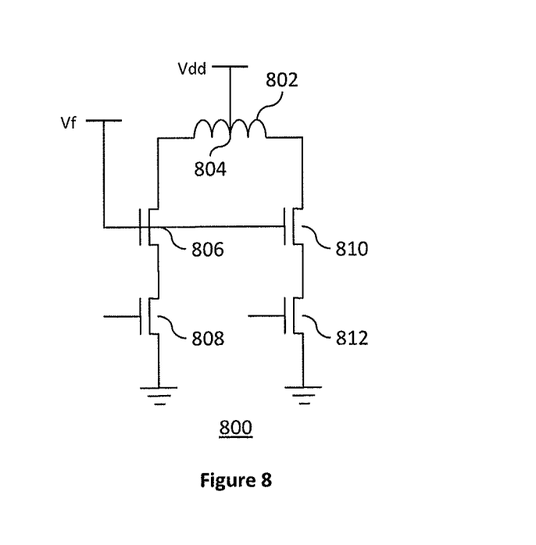
FIG. 8 shows an example of an amplifier circuit.

FIG. 8 shows an example of a simple power amplifier 800 connected to a first winding 802 of a transformer (the second winding is not shown). The first winding 802 includes a centre tap 804 that is connected to a bias voltage, shown as $V_{dd}$ in this example though other bias voltages or a bias current may be used. The power amplifier comprises first and second transistors 806, 808 connected in series between one side of the first winding 802 and ground, and third and fourth transistors 810 and 812 connected in series between the other side of the winding 802 and ground. The gates of transistors 806 and 810 are connected to a fixed voltage Vf. A differential input signal is provided to the gates of the transistors 808, 812.

Other power amplifiers may also be used, in place of the power amplifier 800, which are suitable for receiving a bias voltage in the manner shown. This implementation may reduce the number of components that may be used within the amplifier and/or may widen the range of suitable amplifiers that may be used.

The power splitter/combiner according to embodiments of the invention may be used in RF applications, for example RF CMOS applications. Example technologies in which embodiments of the invention may be used include 802.11 ac and 802.11 af, but embodiments may be suitable for other applications, for example 802.11b, g and n, Bluetooth, and other wireless and/or wireless applications.

Figure 9:
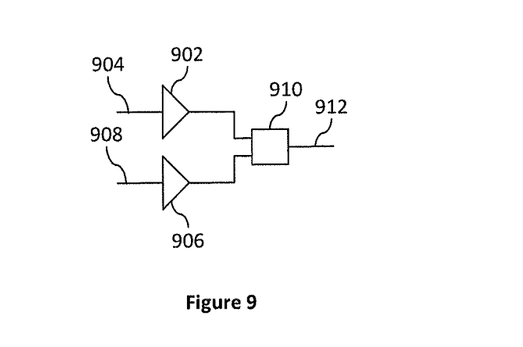
FIG. 9 shows an example of at least a portion of a transmitter according to embodiments of the invention.

FIG. 9 shows an example of part 900 of a transmitter (other parts are not shown for clarity but are well known to those skilled in the art). A first amplifier 902 receives a first input signal 904. A second amplifier 906 receives a second input signal 908. The outputs of the amplifiers are provided to a power combiner 910 according to embodiments of the invention. For example, the power combiner 910 may comprise the circuit 600 of FIG. 6, the circuit 700 of FIG. 7 or any of the variations disclosed. The power combiner 910 provides an output signal 912 which is a combination of the output signals from the amplifiers 902 and 906, i.e. a combination of the power of both signals.

One example of an application of the circuit 900 is in outphasing. This approach solves the problem of amplifier non-linearity by having the two amplifiers 902 and 906 output a signal of the same frequency and constant amplitude. The phase of the two signals can be adjusted to provide an output signal of desired amplitude and phase. In addition, the amplifiers may be operated at an amplitude that results in high efficiency of the amplifiers. This may outweigh the disadvantage of wasted power when out-of-phase signals are combined to provide a signal that is lower in amplitude than the signals from the amplifiers 902 and 906.

The values of components of the circuits 600 and 700 shown in FIGS. 6 and 7 respectively may be selected to provide a desired input or output impedance. For example, where the transformers used have an equal number of first and second windings, the input and output impedances may be substantially the same, for example 50 ohms. However, in alternative embodiments the relative number of windings between the first and second windings may be adjusted which may adjust the input impedance and/or the output impedance for a particular input or output. As an example, the transformer windings may be selected such that the output impedance is 50 ohms, but the input impedance for a signal may be higher or lower. This has the advantage that, for example, the input impedance may be selected to operate a connected amplifier at high efficiency. Similarly, additionally or alternatively, the output impedance of an output signal may be selected in view of connected components.

Figure 10:
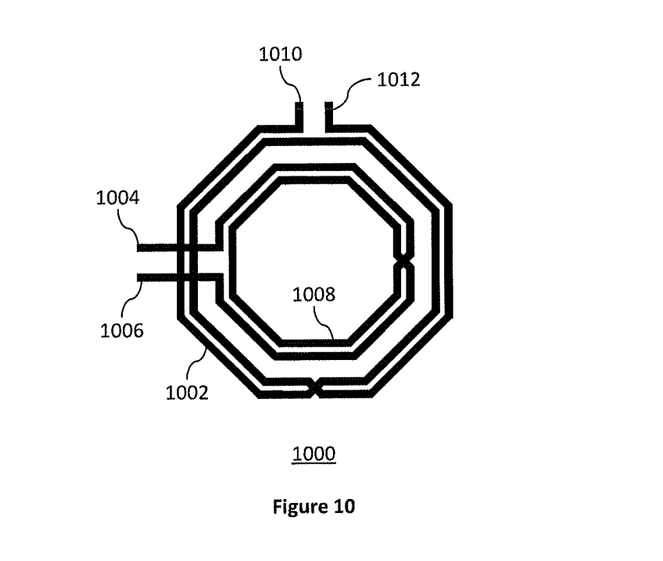
FIG. 10 shows an example of a transformer.

FIG. 10 shows an example of a micro transformer 1000. The transformer 1000 includes a first winding 1002 having a pair of terminals 1004 and 1006 which can be used to provide or extract a signal. The transformer 1000 also includes a second winding 1008 having a pair of terminals 1010 and 1012 which can be used to extract or provide a signal. Therefore, a balanced signal may be provided to and extracted from the transformer, though in some embodiments, one of the terminals 1004 and 1006, and/or one of the terminals 1010 and 1012, may be connected to ground such that an unbalanced input and/or output signal may be used.

Figure 11:
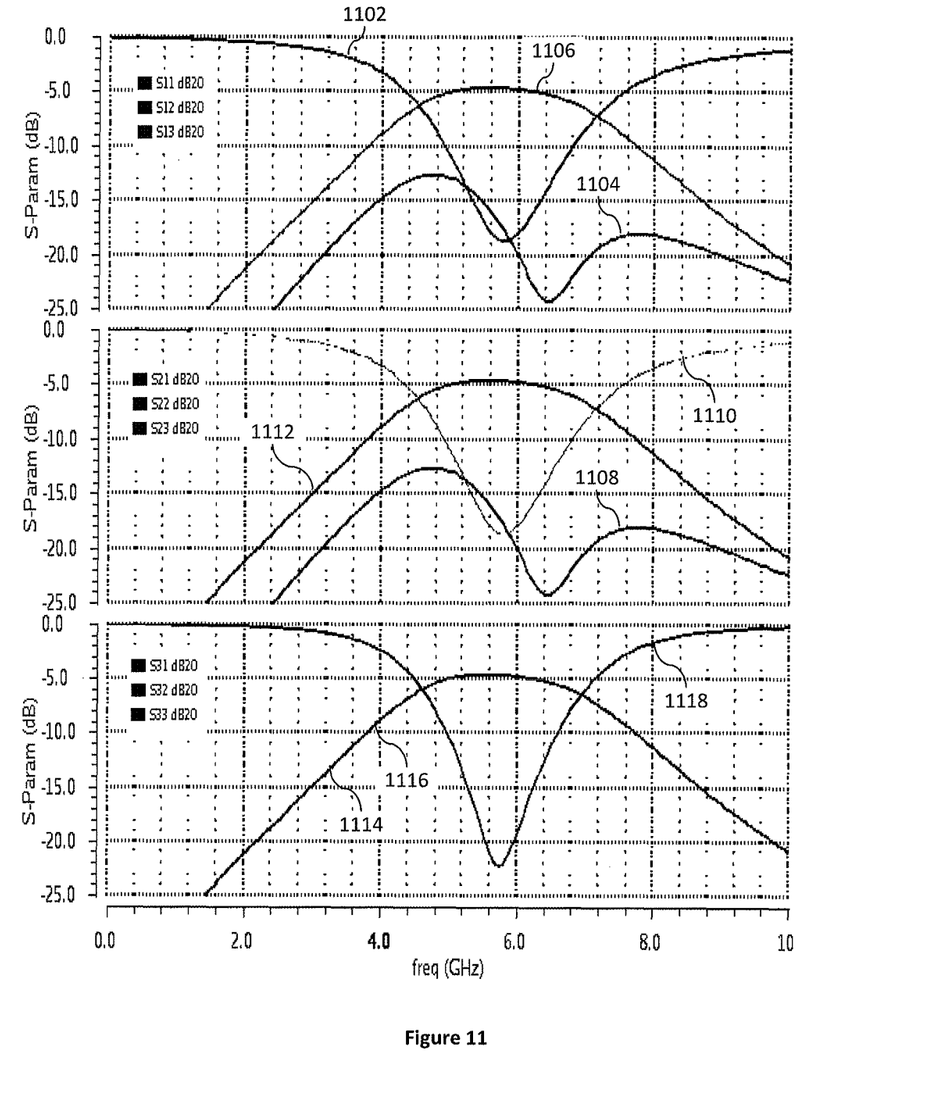
FIG. 11 shows the performance of a circuit according to embodiments of the invention.

When the transformer is used in the circuit 700 of FIG. 7, the power splitter/combiner exhibits the scattering parameters (S-parameters) shown in FIG. 11. Specifically, the curve 1102 shows the $S_{11}$ parameter, the curve 1104 shows the $S_{12}$ parameter, the curve 1106 shows the $S_{13}$ parameter, the curve 1108 shows the $S_{21}$ parameter, the curve 1110 shows the $S_{22}$ parameter, the curve 1112 shows the $S_{23}$ parameter, the curve 1114 shows the $S_{31}$ parameter, the curve 1116 shows the $S_{32}$ parameter (this coincides with the $S_{31}$ parameter) and the curve 1118 shows the $S_{33}$ parameter.

Figure 12:
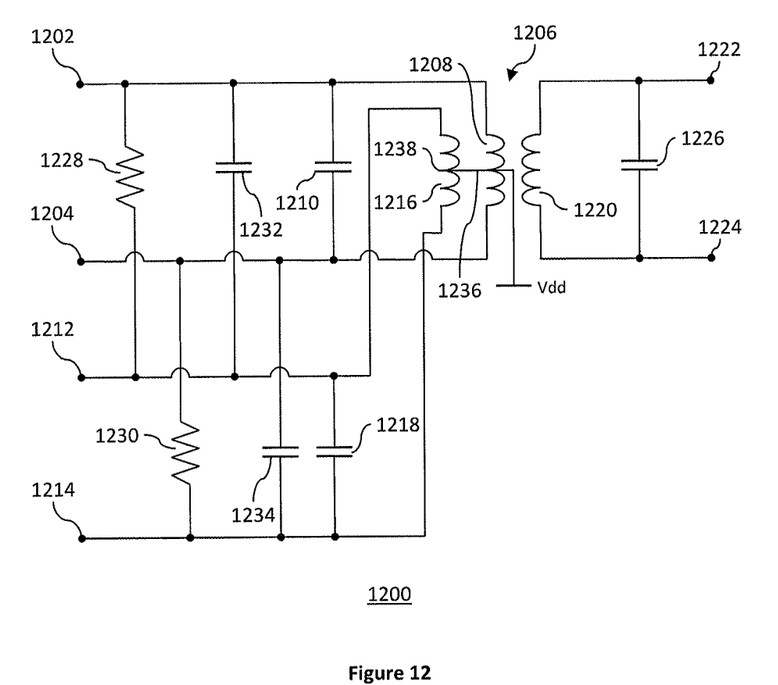
FIG. 12 shows a fourth circuit according to embodiments of the invention.

Although the circuits 600 and 700 include two transformers, one for each input signal (when used as a power combiner), other embodiments may comprise a single, three-winding transformer. An example of such a circuit 1200 is shown in FIG. 12. The circuit 1200 includes a first pair of nodes 1202 and 1204. A transformer 1206 includes a first winding 1208 connected between the nodes 1202 and 1204. A first capacitor 1210 is connected between the nodes 1202 and 1204.

The circuit 1200 also includes a second pair of nodes 1212 and 1214. The transformer 1206 includes a second winding 1216 connected between the nodes 1214 and 1216, and a second capacitance 1218 connected between the nodes 1212 and 1214.

The transformer 1206 includes a third winding 1220 connected between a third pair of nodes 1222 and 1224. A third capacitor 1226 is connected between the nodes 1222 and 1224. A first resistor 1228 is connected between the nodes 1202 and 1212, and a second resistor 1230 is connected between the nodes 1204 and 1214.

In the three-winding transformer 1206, there may be leakage inductance between the first winding 1208 and second winding 1216. Therefore, to at least partially counteract this, a fourth capacitor 1232 is connected between nodes 1202 and 1212, and a fifth capacitor is connected between nodes 1204 and 1214.

The circuit 1200 can be operated as a power splitter or power combiner. The embodiment shown may be used with differential signals, though one, both or all of the input and output signals may be single-ended with connection of the appropriate node to ground (or some other reference voltage).

The components shown in the Figures and described above may be replaced with similar or equivalent components comprising more or fewer components as appropriate. Additionally or alternatively, embodiments of the invention may include further components that are not shown or described.

The invention claimed is:

1. An electronic device comprising:
   first means arranged to transfer a first signal between a first node and a second node with a first predetermined phase shift;
   second means, connected in series with the first means, arranged to transfer a second signal between a third node and the second node with a second predetermined phase shift;
   a resistance connected between the first node and the third node;
   wherein the first means comprises a first capacitance connected between a first pair of nodes, a second capacitance connected between a second pair of nodes, and a first transformer having a first winding connected between the first pair of nodes and a second winding connected between the second pair of nodes, wherein the first pair of nodes includes the first node and the second pair of nodes includes the second node.

2. The device of claim 1, wherein the second means comprises a third capacitance connected between a third pair of nodes, a fourth capacitance connected between the second pair of nodes, and a second transformer having a first winding connected between the third pair of nodes and a second winding connected between the fourth pair of nodes, and wherein the third pair of nodes includes the third node.

3. The device of claim 2, wherein one of the third pair of nodes is connected to ground.

4. The device of claim 3, wherein another of the third pair of nodes is arranged to receive an input signal.

5. The device of claim 3, wherein another of the third pair of nodes is arranged to provide an output signal.

6. The device of claim 2, wherein the third pair of nodes is arranged to receive a differential input signal.

7. The device of claim 2, wherein the third pair of nodes is arranged to provide a differential output signal.

8. The device of claim 2, wherein the resistance comprises a first resistance connected between one of the first pair of nodes and one of the third pair of nodes, and a second resistance connected between another of the first pair of nodes and another of the third pair of nodes.

9. The device of claim 2, wherein the first winding of the second transformer has a centre tap arranged to be connected to a bias voltage.

10. The device of claim 1, wherein one of the first pair of nodes is connected to ground.

11. The device of claim 10, wherein another of the first pair of nodes is arranged to receive an input signal.

12. The device of claim 10, wherein another of the first pair of nodes is arranged to provide an output signal.

13. The device of claim 1, wherein the first pair of nodes is arranged to receive a differential input signal.

14. The device of claim 1, wherein the first pair of nodes is arranged to provide a differential output signal.

15. The device of claim 1, wherein one of the second pair of nodes is connected to ground.

16. The device of claim 15, wherein another of the second pair of nodes is arranged to receive an input signal.

17. The device of claim 15, wherein another of the second pair of nodes is arranged to provide an output signal.

18. The device of claim 1, wherein the second pair of nodes is arranged to receive a differential input signal.

19. The device of claim 1, wherein the second pair of nodes is arranged to provide a differential output signal.

20. The device of claim 1, wherein the first predetermined phase shift is substantially equal to the second predetermined phase shift.

21. The device of claim 1, wherein the first winding of the first transformer has a centre tap arranged to be connected to a bias voltage.

22. The device of claim 1, wherein the device is a power combiner.

23. The device of claim 1, wherein the device is a power splitter.

24. The device of claim 1, wherein the first winding and second winding of the first transformer have an equal or different number of turns.

25. A communications device including an electronic device as claimed claim 1.

26. An electronic device, comprising:
a first capacitance connected between a first pair of nodes, a second capacitance connected between a second pair of nodes, and a transformer having a first winding connected between the first pair of nodes and a second winding connected between the second pair of nodes;
a third capacitance connected between a third pair of nodes, the transformer having a third winding connected between the third pair of nodes;
a first resistance connected between one of the first pair of nodes and one of the third pair of nodes; and
a second resistance connected between another of the first pair of nodes and another of the third pair of nodes.

27. The device of claim 26, comprising a fourth capacitance connected in parallel with the first resistance, and a fifth capacitance connected in parallel with the second resistance.

28. The device of claim 26, comprising a further capacitance connected between the second pair of nodes.

29. The device of claim 26, wherein at least two of the first, second and third windings have an equal or different number of turns.

* * * * *

UNITED STATES PATENT AND TRADEMARK OFFICE
CERTIFICATE OF CORRECTION

| | | |
|---|---|---|
| PATENT NO. | : 8,779,826 B1 | Page 1 of 1 |
| APPLICATION NO. | : 13/750292 | |
| DATED | : July 15, 2014 | |
| INVENTOR(S) | : Chang et al. | |

It is certified that error appears in the above-identified patent and that said Letters Patent is hereby corrected as shown below:

In the Drawings

In Fig. 9, Sheet 4 of 6, insert Main Designator -- 900 -- between "906" and Figure 9".

In the Specification

In Column 4, Line 2, delete "306," and insert -- 308, --, therefor.

In Column 4, Line 4, delete "306." and insert -- 308. --, therefor.

In Column 5, Line 5, delete "618" and insert -- 616 --, therefor.

In Column 6, Line 27, delete "7002" and insert -- 702 --, therefor.

Signed and Sealed this
Tenth Day of February, 2015

Michelle K. Lee
*Deputy Director of the United States Patent and Trademark Office*